United States Patent [19]

Choi

[11] Patent Number: 5,726,066
[45] Date of Patent: Mar. 10, 1998

[54] METHOD FOR MANUFACTURING AN INFRARED SENSOR ARRAY

[75] Inventor: Jun Rim Choi, Seoul, Rep. of Korea

[73] Assignee: LG Electronics Inc., Seoul, Rep. of Korea

[21] Appl. No.: 600,548

[22] Filed: Feb. 13, 1996

Related U.S. Application Data

[62] Division of Ser. No. 401,878, Mar. 10, 1995, abandoned.

[30] Foreign Application Priority Data

Mar. 10, 1994 [KR]   Rep. of Korea ............... 4699/1994

[51] Int. Cl.$^6$ .................................................. H01L 21/77
[52] U.S. Cl. .................. 437/3; 437/4; 437/228 SEN; 437/901
[58] Field of Search ............... 437/3, 4, 5, 901, 437/921, 228 H, 228 O, 228 SEN

[56] References Cited

U.S. PATENT DOCUMENTS

| | | | |
|---|---|---|---|
| 4,692,994 | 9/1987 | Moniwa et al. | 437/83 |
| 5,068,203 | 11/1991 | Logsdon et al. | 437/921 |
| 5,095,401 | 3/1992 | Zavracky et al. | 437/51 |
| 5,164,339 | 11/1992 | Gimpelson | 437/921 |
| 5,165,289 | 11/1992 | Tilmans | 73/702 |
| 5,426,412 | 6/1995 | Tomonari et al. | 250/338.1 |

FOREIGN PATENT DOCUMENTS

| | | | |
|---|---|---|---|
| 3136379 | 6/1991 | Japan | 437/3 |
| 3287022 | 12/1991 | Japan | 250/338.1 |

*Primary Examiner*—Michael Trinh
*Attorney, Agent, or Firm*—John P. White

[57] ABSTRACT

An infrared sensor array and manufacturing method thereof is disclosed including a substrate; a supporter having a space portion for adiabatic structure between the substrate and supporter; and a plurality of infrared sensors arranged with a predetermined distance each other on the supporter above the space portion.

10 Claims, 9 Drawing Sheets

F I G.4A
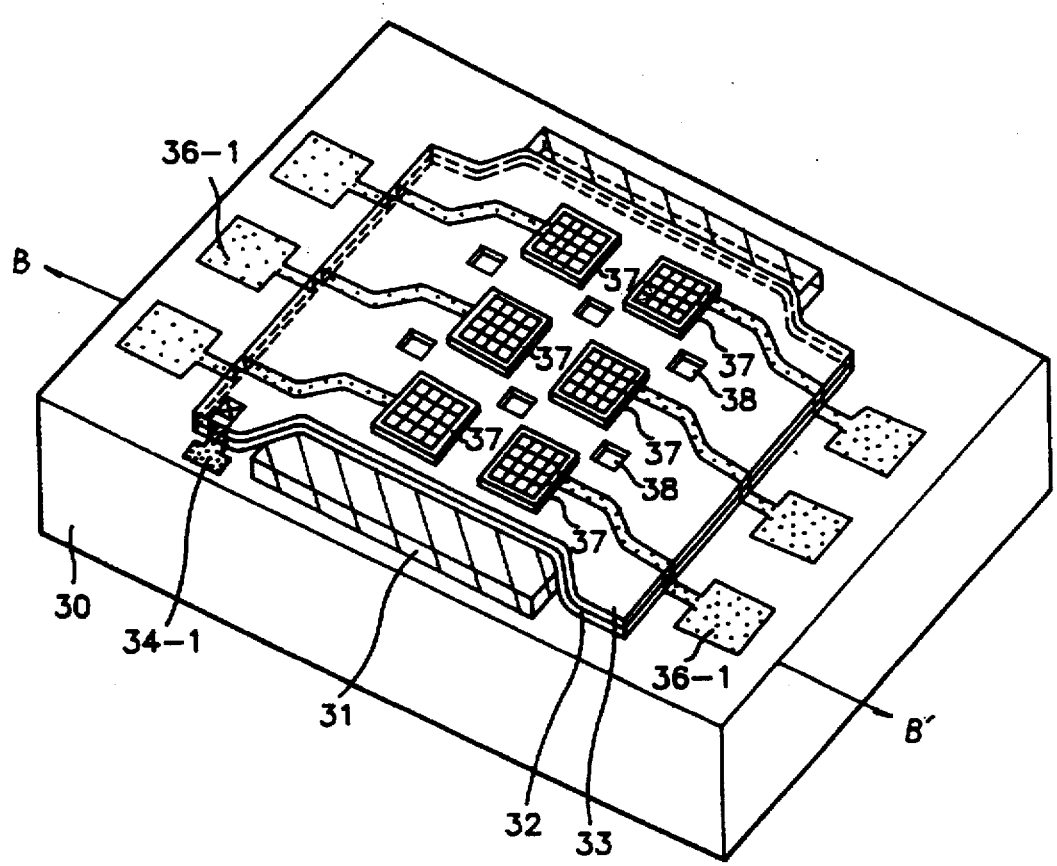

METHOD FOR MANUFACTURING AN INFRARED SENSOR ARRAY

This application is a divisional of U.S. Ser. No. 08/401,878, filed Mar. 10, 1995, abandoned.

BACKGROUND OF THE INVENTION

The present invention relates to an infrared sensor array and a method for manufacturing the same, and particularly to an infrared sensor array and a method for manufacturing the same using surface micromachining technology which can minimize heat loss and simplify the manufacturing process.

FIG. 1 is a constitution diagram of the conventional pyroelectric infrared sensor array.

Referring to FIG. 1, the conventional infrared sensor array 20 has numbers of infrared sensors 18 arranged in a line on a silicon substrate 10 of membrane structure.

FIG. 2 is a cross-sectional view of one infrared sensor 18 of the infrared sensor array 20 in FIG. 1.

Referring to FIG. 1 & FIG. 2, the conventional infrared sensor 18 is provided with an oxide layer 12 of an insulating layer on the silicon substrate 10 having a supporter 11, a lower electrode 13 formed on the oxide layer 12 which corresponds to the supporter 11, an infrared sensing layer 14 and an upper layer 15, subsequently.

The unexplained numerals 16 and 17 mean a pad for the lower electrode and a pad for the upper electrode.

A method for manufacturing the infrared sensor array having such structure is comprised of ion implanting into the silicon substrate 10 for a supporter in which p-type impurity such as is ion implanted, foxing an oxide layer 12 as an insulating layer on the whole surface of the ion implanted substrate, successively forming a lower electrode 13 on the oxide layer 12, an infrared sensing layer 14 consisted of ferroelectric body and an upper electrode 15 to form numbers of infrared sensors 18, and forming a supporter by selectively anisotropic etching the backside of the silicon substrate corresponding to the infrared sensor.

During the manufacture of the infrared sensor array, the supporter is formed by etching the backside of the silicon substrate. The etching ratio between the portion where p-type impurity ion is implanted and the portion where p-type impurity ion is not implanted of the silicon substrate is different. When etching the backside of the silicon substrate, the portion where p-type impurity ion is implanted is not etched and remain as the supporter.

As shown above, the infrared sensor array is provided with an adiabatic structure by etching backside of the substrate to prevent heat loss of the sensor.

FIG. 3 is a constitution diagram of another conventional infrared sensor array.

The infrared sensor array in FIG. 3 has similar structure as the infrared sensor array in FIG. 1.

However, the infrared sensor array in FIG. 1 is provided with infrared sensors 18 on the front side of the silicon substrate and is provided with an adiabatic structure on the backside of the silicon substrate by etching, through two-surface processing. Meanwhile, the infrared sensor in FIG. 3 is provided with infrared sensors 18 on the front side of the silicon substrate together with the adiabatic structure by selectively etching the front side of the silicon substrate where the infrared sensors are formed, through one-surface processing.

The infrared sensor array is manufactured by forming infrared sensors 18 on the supporter 11 and forming the adiabatic structure through forming a groove by etching the silicon substrate under the supporter. That is, p-type impurity such as boron is ion implanted into the front side of the silicon substrate 10 for forming the supporter. Infrared sensors 18 having the adiabatic structure as shown in FIG. 3 are formed on the silicon substrate. Then, the whole surface of the silicon substrate except the portion corresponding to the supporter 11 is anisotropically etched to obtain the conventional infrared sensor array.

In the infrared sensor array 20 illustrated in FIG. 1 or in FIG. 3, if heat is absorbed by the infrared sensing layer made of pyroelectric material, surface charge corresponding to the amount of the infrared according to the temperature difference came to be generated at the infrared sensing layer. The generated surface charge induces charge difference between the upper and lower electrodes 13 and 15. The charge difference between the upper and lower electrodes 13 and 15 is detected and this detected charge difference is converted to voltage and output. The converted voltage is amplified, treated to signal and treated to image.

This kind of infrared sensor array has adiabatic structure to prevent the loss of heat which should be detected at the infrared sensing layer. For the case of infrared sensor array in FIG. 1, the adiabatic structure is formed by etching back side of the substrate and for the case of infrared sensor array in FIG. 3, the adiabatic structure is formed by etching front side of the substrate.

However, for both infrared sensor arrays in FIG. 1 and FIG. 3 using silicon substrate as the substrate, EDP (ethylene diamine pyrocatecol) solution or KOH solution is used for etching the silicon substrate for manufacturing adiabatic structure. These solutions are strong carcinogenic substances and become serious pollutants. And, since etching selectivity of these solutions to the silicon substrate is low, a problem that the sensor portion is undesirably affected comes out. Additionally, since etching time needed for etching the silicon substrate is long, the processing time needed for manufacturing the infrared sensor array is lengthened and this lowers the yield.

Moreover, the thickness of the silicon substrate under etching is hard to control in the infrared sensor arrays.

SUMMARY OF THE INVENTION

An object of the present invention is to provide an infrared sensor array and a simple method for manufacturing the same using surface micromachining technology without etching a silicon substrate.

Another object of the present invention is to provide an infrared sensor array and a method for manufacturing the same by forming a space portion between a substrate and a supporter using surface micromachining technology to prevent the loss of detected heat without etching a silicon substrate.

To achieve the object, there is provided in the present invention an infrared sensor array comprising a substrate; a supporter having a space portion for adiabatic structure between the substrate and the supporter; and numbers of infrared sensors arranged with a predetermined distance on the supporter above the space portion. Method for manufacturing the same comprises forming a sacrificial layer on a predetermined region on a substrate; forming a supporter to cover the sacrificial layer; forming numbers of infrared sensors arranged with a predetermined distance on the supporter above the sacrificial layer; and removing the sacrificial layer to form a space portion for adiabatic structure.

BRIEF DESCRIPTION OF THE DRAWINGS

The above objects and advantages of the present invention will become more apparent by describing in detail a preferred embodiment thereof with reference to the attached drawings in which:

FIGS. 4A & 4B illustrate constitution diagrams of an infrared sensor array according to an embodiment of the present invention, in which FIG. 4A corresponds to the diagram before removing the sacrificial layer and FIG. 4B corresponds to the diagram after removing the sacrificial layer.

DETAILED DESCRIPTION OF THE INVENTION

Figure 1:
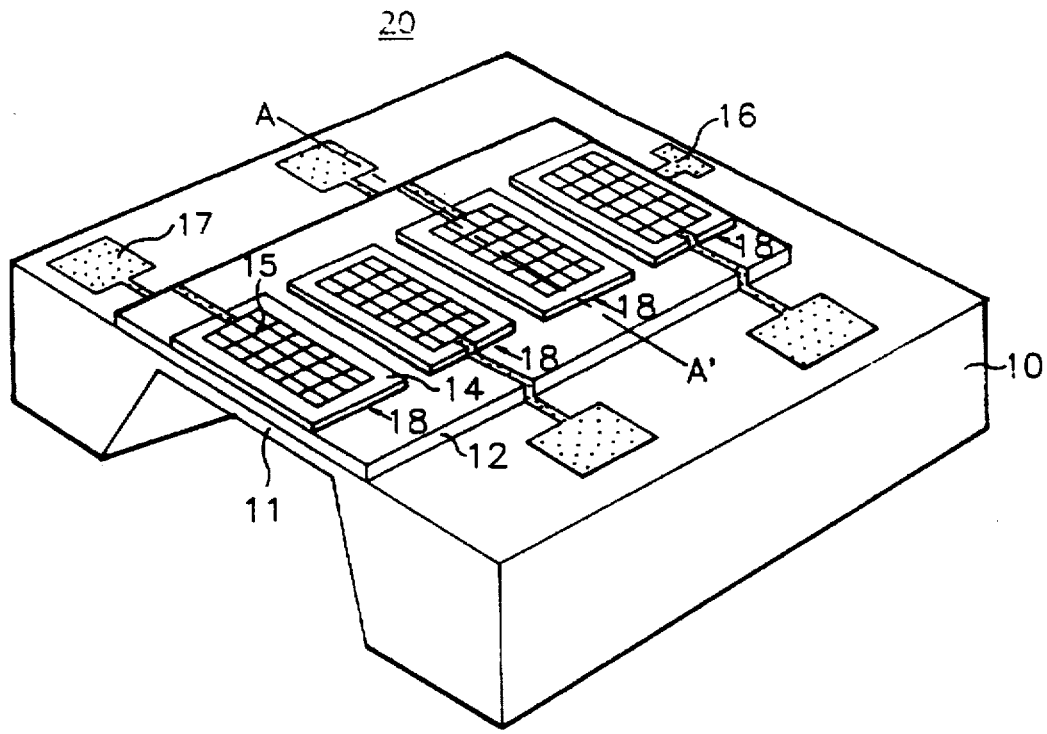
FIG. 1 is a constitution diagram of the conventional infrared sensor array.
Figure 2:
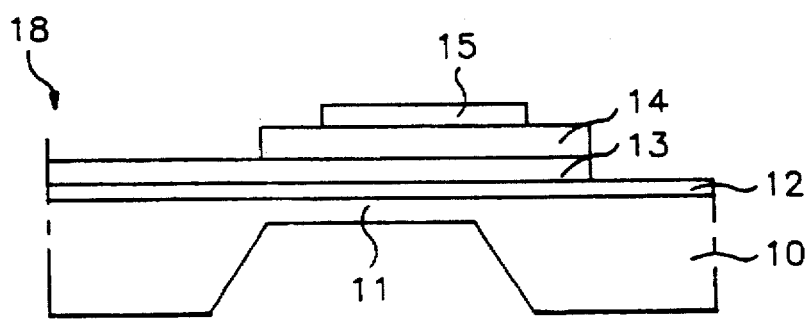
FIG. 2 is a cross-sectional view cut along the line A—A of one infrared sensor 18 of the infrared sensor array 20 in FIG. 1.
Figure 3:
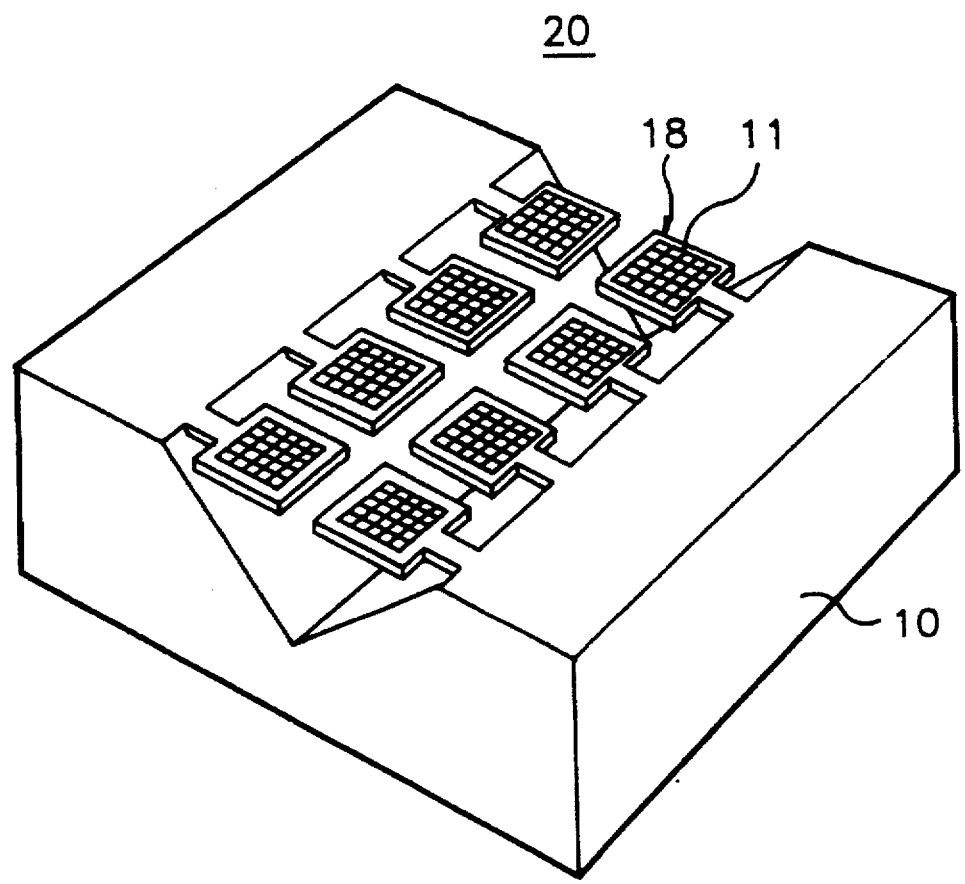
FIG. 3 is a constitution diagram of another conventional infrared sensor array.
Figure 4B:
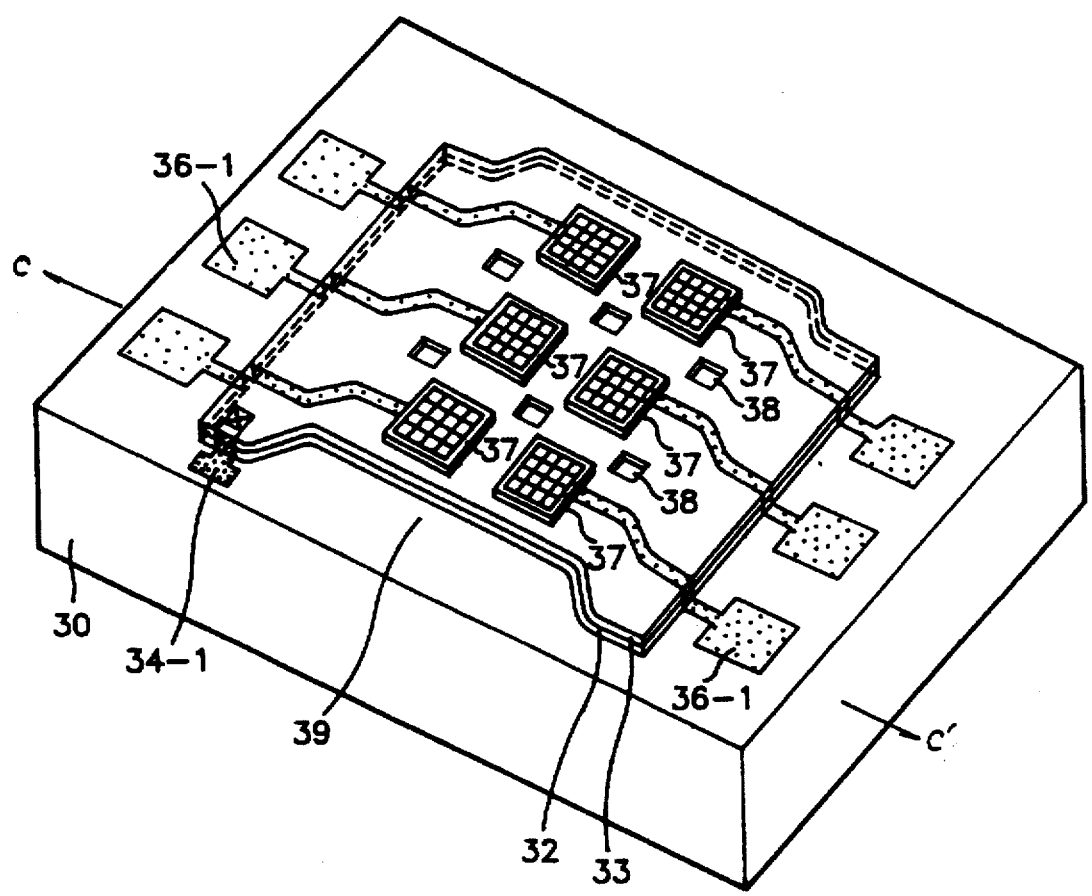

FIGS. 4A & 4B illustrate constitution diagrams of an infrared sensor array according to an embodiment of the present invention, in which FIG. 4A corresponds to the diagram before removing the sacrificial layer and FIG. 4B corresponds to the diagram after removing the sacrificial layer.

Figure 5A:
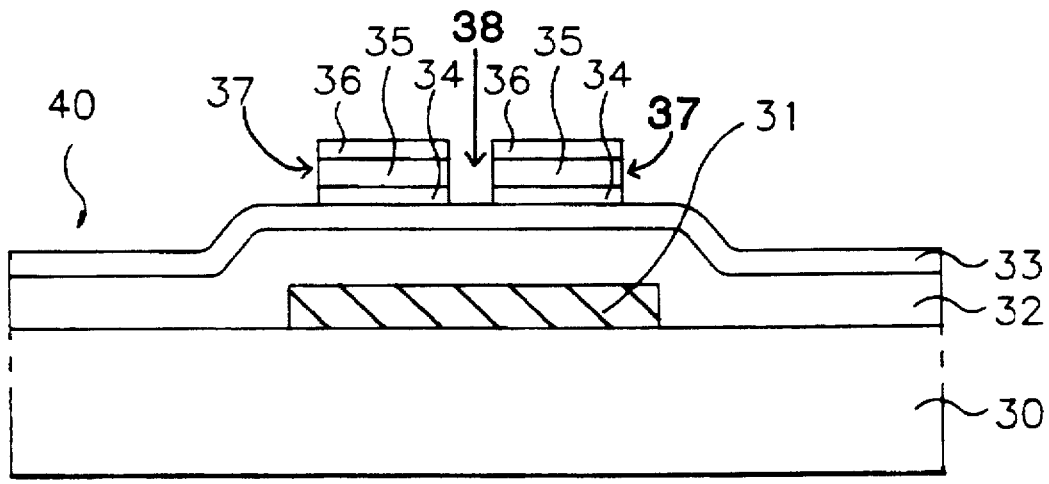
FIG. 5A is a cross-sectional view cut along the line B–B' in FIG. 4A.
Figure 5B:
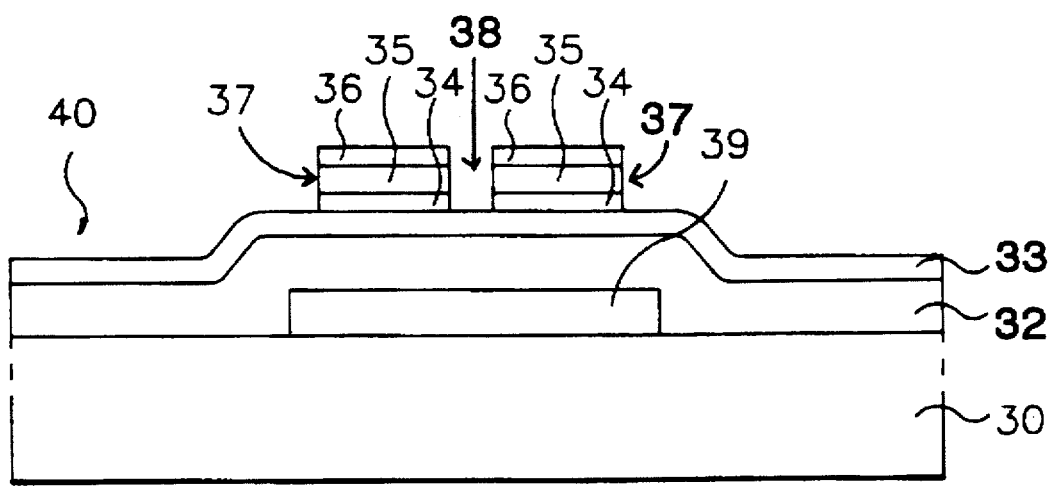
FIG. 5B is a cross-sectional view cut along the line C–C' in FIG. 4B.

FIG. 5A is a cross-sectional view cut along the line B–B' in FIG. 4A and FIG. 5B is a cross-sectional view along the line C–C' in FIG. 4B.

Method for manufacturing the infrared sensor array according to an embodiment of the present invention will be described in detail referring to the FIG. 4 and FIG. 5.

At first, a sacrificial layer 31 is formed on a desired portion of a substrate by depositing insulating material such as PSG (phosphor silicate glass) or SOG (spin on glass) in a predetermined thickness on a semiconductor substrate 30 such as silicon substrate or gallium-arsenic (GaAs) substrate and patterning as shown in FIG. 4A and FIG. 5A.

After then, p(phosphorous)-doped polycrystalline silicon layer 32 covering the sacrificial layer 31 is deposited on the substrate 30 and an oxide layer 33 is formed thereon as an insulating layer. The oxide layer($SiO_2$) 33 and the polycrystalline silicon layer 32 are patterned. The patterned polycrystalline silicon layer 32 plays the role of a supporter for supporting subsequently formed infrared sensor. A nitride layer ($Si_3N_4$) can be used instead of the polycrystalline silicon layer for the supporter.

In case of using the polycrystalline silicon layer as for the supporter 33, impurity such as phosphorous is doped while in case of using the nitride layer as for the supporter, platinum is deposited on the surface of the nitride layer so as to form the lower electrode.

After then, infrared sensors 37 are formed with a constant distance each other on the oxide layer 33 corresponding to the sacrificial layer 31. At this time, each infrared sensor is consisted of a lower electrode 34, an infrared sensing layer 35 and an upper electrode 36, successively formed on the oxide layer 33.

After forming the infrared sensors 37, at least one etching window 38 is formed by etching oxide layer 33 where the infrared sensor 37 is not formed and a portion of the supporter 32. This etching window 38 is formed for easy etching of subsequent sacrificial layer in a short time.

Referring to FIGS. 4B & 5B, a space portion 39 is formed for adiabatic structure by etching the sacrificial layer 31 after forming numbers of infrared sensors 37 and numbers of etching windows 38.

That is, the sacrificial layer 31 is removed using etching solution which can selectively etch the sacrificial layer formed of PSG or SOG with respect to the semiconductor substrate and the supporter such as hydrogenfluoride solution to form a space portion 39 to prevent heat loss of the sensor.

At this time, the etching window 38 improves the etching velocity and so reduces the process time. When the product having the etching windows is dipped into a hydrogenfluoride solution, the etching solution comes to easily penetrate the product through the etching windows and the lower portion of the supporter 32 can be easily etched out.

After removing the sacrificial layer 31, pads for the upper and lower electrodes 36-1 and 34-1 which are connected to the upper and lower electrodes 36 and 34 of the infrared sensors 37 on the semiconductor substrate 30 are formed. At last, the infrared sensor array 40 according to an embodiment of the present invention is obtained.

In the infrared sensor array 40 according to an embodiment of the present invention, a separate supporter is formed on the semiconductor substrate different from the conventionally formed supporter through etching the substrate. Moreover, the adiabatic structure can be obtained from the space portion formed by removing the sacrificial layer 31 between the semiconductor substrate 30 and the supporter 32 and so the formation of the adiabatic structure through etching the substrate as in the conventional method is not needed. Therefore, the manufacture of the array is advantageous and the processing time is shortened. The etching windows can reduce the processing time by accelerating the etching velocity.

Figure 6A:
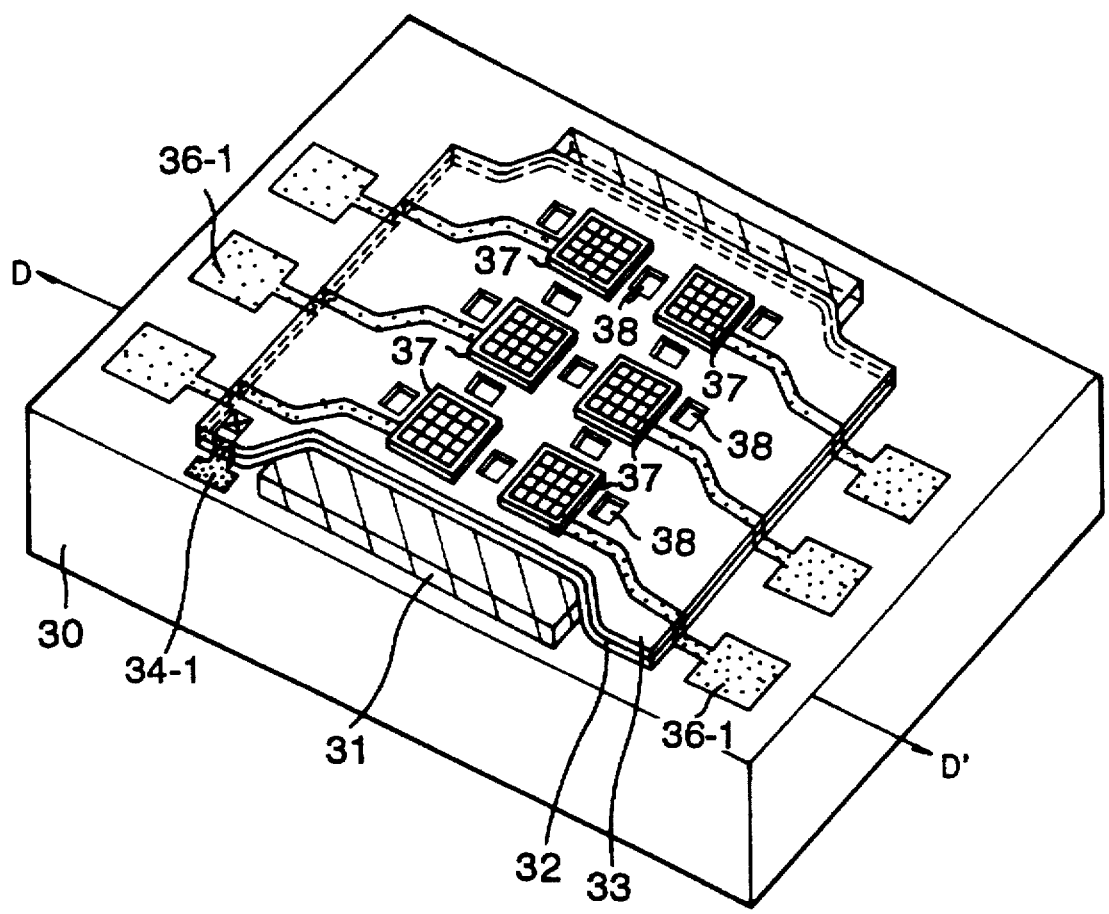
FIGS. 6A & 6B illustrate constitution diagrams of an infrared sensor array according to another embodiment of present invention, in which FIG. 6A corresponds to the diagram before removing the sacrificial layer and FIG. 6B corresponds to the diagram after removing the sacrificial layer.
Figure 6B:
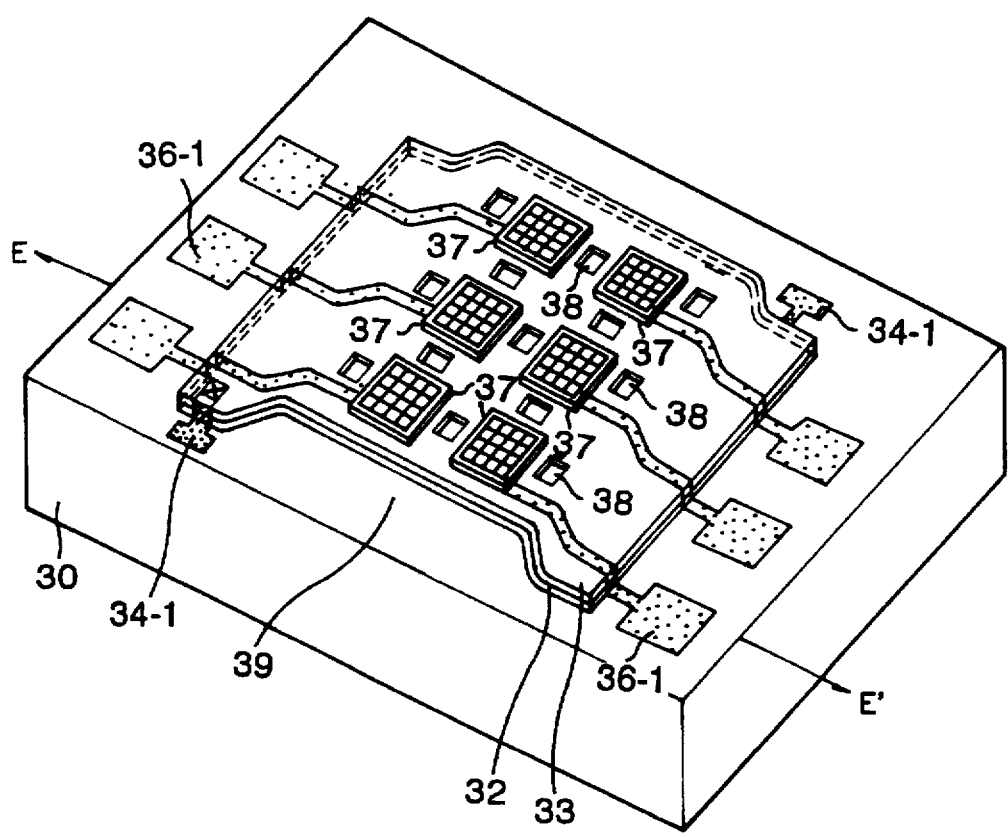

FIGS. 6A & 6B illustrate constitution diagrams of an infrared sensor array according to another embodiment of the present invention, in which FIG. 6A corresponds to the diagram before removing the sacrificial layer and FIG. 6B corresponds to the diagram after removing the sacrificial layer.

Figure 7A:
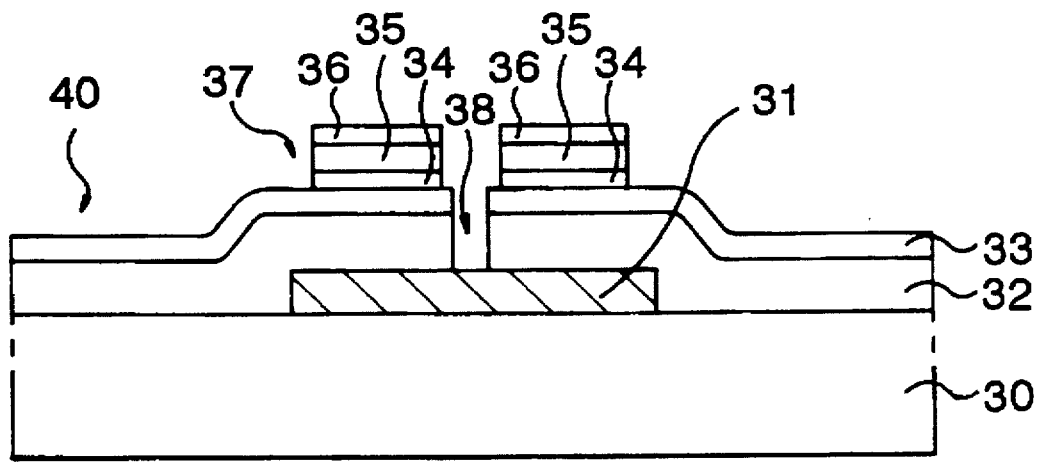
FIG. 7A is a cross-sectional view cut along the line D–D' in FIG. 6A.
Figure 7B:
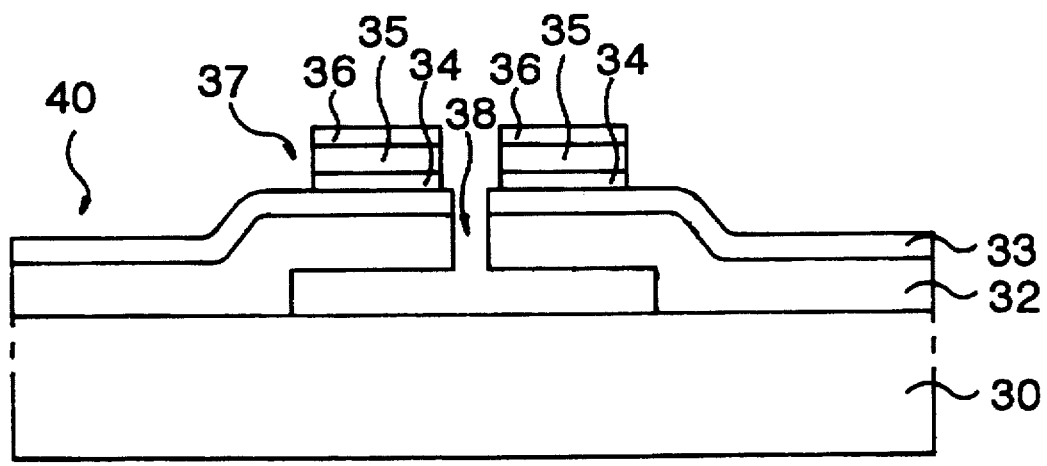
FIG. 7B is a cross-sectional view cut along the line E–E' in FIG. 6B.

FIG. 7A is a cross-sectional view cut along the line D–D' in FIG. 6A and FIG. 7B is a cross-sectional view cut along the line E–E' in FIG. 6B.

Referring to FIG. 6 and FIG. 7, numbers of etching windows 38 are formed between neighboring infrared sensors 37 in the infrared sensor array according to another embodiment of the present invention.

That is, in the infrared sensor array according to another embodiment, etching windows are formed by etching the supporter 32 and the oxide layer 33 of upper and lower and right and left side of each infrared sensor to prevent heat interference between infrared sensors to accomplish clearer heat image.

The etching windows in this embodiment play the role of isolating the neighboring infrared sensors 37 as well as the role of easy etching of the sacrificial layer as in the first embodiment. Therefore, the adiabatic effect can be improved to give high sensitivity and the etching time of the sacrificial layer can be shortened.

Figure 8:
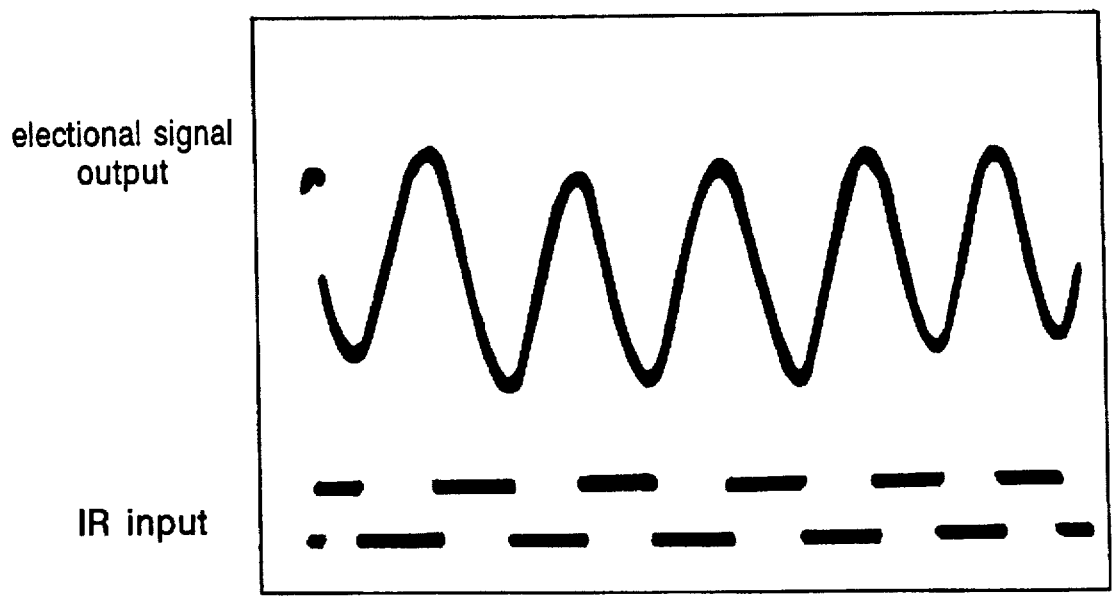
FIG. 8 illustrates input and output waveform diagram of the infrared sensor array of the present invention.

FIG. 8 illustrates an output characteristic with respect to the input infrared of the infrared sensor array of the present invention.

Referring to FIG. 8, the heat loss of the infrared sensing layer is minimized by removing the sacrificial layer between the substrate and the supporter to form an adiabatic space and so the output signal to the input infrared of the infrared sensor array is quickened to the degree of possibly ignoring the response time.

As described above, the process is simplified and the processing time is shortened by forming the adiabatic space without two-surface processing or etching the silicon substrate using harmful solution in the present invention. Therefore, the yield is improved and the heat loss is minimized to improve the heat sensitivity and minute temperature difference might be detected.

What is claimed is:

1. A method for manufacturing an infrared sensor array comprising the steps of:

forming a sacrificial layer on a predetermined region of a substrate;

forming a supporter of polycrystalline silicon to cover the sacrificial layer and the substrate on both sides of the sacrificial layer;

forming numbers of infrared sensors arranged at a predetermined distance from each other on the supporter above the sacrificial layer;

forming etching windows on the upper and lower and right and left side of said infrared sensors; and removing the sacrificial layer to form a space between the supporter and the substrate.

2. The method for manufacturing an infrared sensor array as claimed in claim 1, wherein said sacrificial layer is formed by using materials having higher etching ratio to a predetermined impure solution than said substrate, said supporter and said infrared sensor.

3. The method for manufacturing an infrared sensor array as claimed in claim 2, wherein an insulating layer is used as for said sacrificial layer.

4. The method for manufacturing an infrared sensor array as claimed in claim 2, wherein the etching solution is hydrogenfluoride solution.

5. The method for manufacturing an infrared sensor array as claimed in claim 1, further comprising the step of ion implanting impurity into said polycrystalline silicon layer in case of using polycrystalline silicon layer as for said supporter.

6. The method for manufacturing an infrared sensor array as claimed in claim 1, wherein a silicon nitride layer is used as for said supporter.

7. The method for manufacturing an infrared sensor array as claimed in claim 6, further comprising the step of depositing platinum on the surface of said nitride layer in case of forming said nitride layer as for said supporter.

8. The method for manufacturing an infrared sensor array as claimed in claim 1, further comprising the step of forming an insulating layer for insulating said supporter and said infrared sensors after forming said supporter.

9. The method for manufacturing an infrared sensor array as claimed in claim 1, further comprising the step of forming at least one etching window by etching said supporter after forming said infrared sensors and before removing said sacrificial layer;

wherein said etching window plays the role of easy penetration of the etching solution into said reporter to advantageously remove said sacrificial layer.

10. The method for manufacturing an infrared sensor array as claimed in claim 1, further comprising the step of forming at least one etching window by etching said supporter after forming said infrared sensors and before removing said sacrificial layer;

wherein said etching window plays the role of shielding heat interference between neighboring infrared sensor.

* * * * *